United States Patent [19]
Weigert

[11] 4,333,019
[45] Jun. 1, 1982

[54] SILICON CONTROLLED RECTIFIER TRIGGER CIRCUIT

[76] Inventor: Hans Weigert, 284 Franklin Turnpike, Ridgewood, N.J. 07450

[21] Appl. No.: 147,471

[22] Filed: May 7, 1980

[51] Int. Cl.³ .......................................... H03K 17/72
[52] U.S. Cl. ...................... 307/252 N; 307/252 UA; 307/261; 307/273; 361/205
[58] Field of Search ............ 307/252 N, 252 UA, 261, 307/268, 273, 274; 361/205

[56] References Cited

U.S. PATENT DOCUMENTS

| | | | |
|---|---|---|---|
| 3,344,286 | 9/1967 | Mulder | 307/318 |
| 3,345,546 | 10/1967 | Beltramo | 307/252 N |
| 3,373,370 | 3/1968 | Letsinger | 307/318 |
| 3,662,190 | 5/1972 | Naber | 307/252 N |
| 3,671,761 | 6/1972 | Shibuya et al. | 361/205 |
| 3,737,736 | 6/1973 | Stampfli | 361/205 |
| 3,746,969 | 7/1973 | Gessaroli et al. | 307/252 N |
| 3,764,832 | 10/1973 | Stettner | 307/293 |
| 3,947,754 | 3/1976 | Wechsler | 307/252 N |
| 3,971,969 | 7/1976 | Wines et al. | 361/205 |

Primary Examiner—John Zazworsky
Attorney, Agent, or Firm—David A. Jackson; Daniel H. Bobis

[57] ABSTRACT

A silicon controlled rectifier trigger circuit is responsive to an input AC voltage and provides at least one drive pulse per switch activation to a load circuit. Such load circuit advantageously includes an electric stapler or an electric brad driver. Such trigger circuit generally comprises: a two-position switch; first and second capacitors; first and second Zener diodes; a transistor; and a silicon controlled rectifier. The drive pulse is provided to the load circuit when the switch is in its second position; the first capacitor is charged by the input AC voltage when the switch is in its first position; the first Zener diode and the transistor are conductive when the input AC voltage is greater than a first predetermined value; the first and second Zener diodes are conductive and the transistor is non-conductive when the input AC voltage is greater than a second predetermined value; the second capacitor is interposed between the first Zener diode and the transistor; the silicon controlled rectifier is conductive when the transistor is conductive and when the switch is in its second position to provide the drive pulse to the load circuit. According to specific embodiments of the present invention, one and only one drive pulse is provided to the load circuit per switch activation; two and only two drive pulses are provided to the load circuit per switch activation; and the time interval between consecutive drive pulses may be varied utilizing a potentiometer.

17 Claims, 7 Drawing Figures

SILICON CONTROLLED RECTIFIER TRIGGER CIRCUIT

FIELD OF THE INVENTION

This invention relates to a silicon controlled rectifier trigger circuit and, in particular, to such a circuit which is advantageously applicable to electric stapler and electric brad driver mechanisms.

BACKGROUND OF THE INVENTION

Electrically operated stapling devices and associated control circuits for same are known in the prior art. For example, Wines and Power U.S. Pat. No. 3,971,969 entitled "Electrically Operated Stapling Device" discloses means for applying at least two unidirectional drive pulses derived from an input AC voltage for driving a single staple per switch activation. However, such device requires: two switches 23 and 37; and two silicon controlled rectifiers 71 and 86. Further, such device does not provide one pulse per staple at variable intervals nor does it provide either one and only one pulse per switch activation or two and only two pulses per switch activation.

Objects of the present invention are therefore to provide a silicon controlled rectifier trigger circuit which:

Is readily adaptable to an electric stapler or an electric brad driver and which will deliver one and only one staple or brad per switch activation;

If the switch is maintained activated, further drive pulses are delivered at intervals of less than a second to many seconds;

The drive pulse interval can be made adjustable by utilizing a potentiometer;

Utilizes only one activation switch;

Utilizes only one silicon controlled rectifier;

A train of drive pulses can be delivered to the load, each pulse being approximately one-half cycle long and at intervals of from less than a second to many seconds;

Provides two drive pulses per switch activation; and

Provides one drive pulse per switch activation.

SUMMARY OF THE INVENTION

A silicon controlled rectifier trigger circuit is responsive to an input AC voltage and provides at least one drive pulse per switch activation to a load circuit. Such load circuit advantageously includes an electric stapler or an electric brad driver. Such trigger circuit generally comprises: a two-position switch; first and second capacitors; first and second Zener diodes; a transistor; and a silicon controlled rectifier. The drive pulse is provided to the load circuit when the switch is in its second position; the first capacitor is charged by the input AC voltage when the switch is in its first position; the first Zener diode and the transistor are conductive when the input AC voltage is greater than a first predetermined value; the first and second Zener diodes are conductive and the transistor is non-conductive when the input AC voltage is greater than a second predetermined value; the second capacitor is interposed between the first Zener diode and the transistor; the silicon controlled rectifier is conductive when the transistor is conductive and when the switch is in its second position to provide the drive pulse to the load circuit.

Features of the present invention are therefore that:

A plurality of drive pulses is delivered at variable intervals as determined by the ratio of first and second resistor values;

The load activation period can be adjusted by utilizing a potentiometer whose wiper arm is interposed between first and second resistors;

There are utilized first and second serially connected Zener diodes as delay elements;

The base of the transistor is driven positive only when the positive half-cycle input wave is more positive by the Zener voltage of said first diode and wherein the drive to the base is essentially terminated when the positive half-cycle input wave is more positive by the sum of the Zener voltages of said first and second diodes; and The action of said second Zener diode limits the time during which the base of the transistor is driven to near the zero crossover point of the input AC voltage whereby approximately one half-cycle of power is delivered to the load circuit

BRIEF DESCRIPTION OF THE DRAWING

The above and other objects, features, and advantages of the present invention will be better appreciated from the following detailed description and the drawing in which.

DETAILED DESCRIPTION

Figure 1:
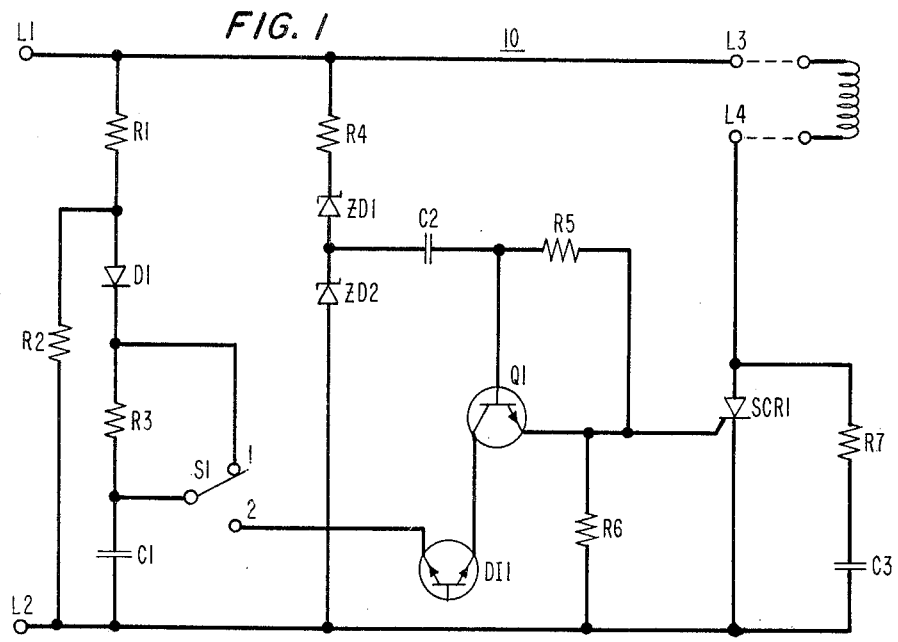
FIG. 1 is a circuit diagram of a first illustrative embodiment of a silicon controlled rectifier trigger circuit according to the present invention.

FIG. 1 is a circuit diagram of silicon controlled rectifier trigger circuit 10 according to the present invention. Generally, trigger circuit 10 is responsive to an alternating current voltage at input terminals L1 and L2 and provides at least one activation or driving pulse per switch activation to the load at output terminals L3 and L4. The elements of trigger circuit 10 and their recommended parameters or values are as follows:

| Element | Parameter or Value |
| --- | --- |
| Resistor R1 | 100 K ohms |
| Resistor R2 | 220 K ohms |
| Resistor R3 | 10 M ohms |
| Resistor R4 | 10 K ohms |
| Resistor R5 | 10 K ohms |
| Resistor R6 | 100 ohms |
| Resistor R7 | 22 ohms |
| Capaciter C1 | .1 micro farads |
| Capaciter C2 | .1 micro farads |
| Capaciter C3 | .1 micro farads |
| Diac DI1 | GT60 or GT40 |
| Transistor Q1 | BN 870 or 2N5550 |
| Silicon Controlled Rectifier SCR1 | Hudson or Teccor |
| Diode D1 | 1N 4004 |
| Zener Diode ZD1 | 1N 967 |
| Zener Diode ZD2 | 1N 967 |
| Switch S1 | Two-Position Switch |

The setting forth of the above elements and recommended values or parameters is done solely for illustrative purposes and is not intended to limit the principle and scope of the disclosed invention.

Trigger circuit 10 may be advantageously used in conjunction with an electric stapler or an electric brad driver connected to output load terminals L3 and L4 for delivery of one staple or lead immediately upon activation of trigger circuit 10. Generally, if switch S1 is held in the 2 position, further activation of the associated stapler or brad device takes place at less than one to many second intervals depending on the values of resistors R1 and R2. Further, Zener diodes ZD1 and ZD2 are utilized as delay elements as shall be hereinafter explained in detail.

Specifically, input terminals L1 and L2 are connected to two lines of an AC voltage. Such AC voltage is typically 115 volts; however, trigger circuit 10 can be designated to operate on other AC input voltages. When switch S1 is in position 1 as shown in FIG. 1, capacitor C1 charges to a voltage determined by the ratio of resistors R1 and R2. When switch S1 is activated to position 2, the voltage across charge storage device or capacitor C1 is applied to the first terminal of 4-layer diode or diac DI1. The second terminal of diac DI1 is connected to the collector of three terminal switching device or transistor Q1. Transistor Q1 has a high enough collector to emitter voltage rating such that no conduction thereof occurs unless the base is driven positive relative to the emitter.

The base voltage necessary to cause transistor Q1 to conduct is supplied through a network comprising resistor R4, Zener diodes ZD1 and ZD2, and capacitor C2. The action of this network is such that the base of transistor Q1 is driven positive only after input terminal L1 is more positive than input terminal L2. This is due to the Zener voltage of two terminal switching device or diode ZD1. The voltage drive to the base of transistor Q1 is essentially terminated after L1 is more positive than L2 by the sum of the Zener voltages of diodes ZD1 and ZD2.

Figure 2:
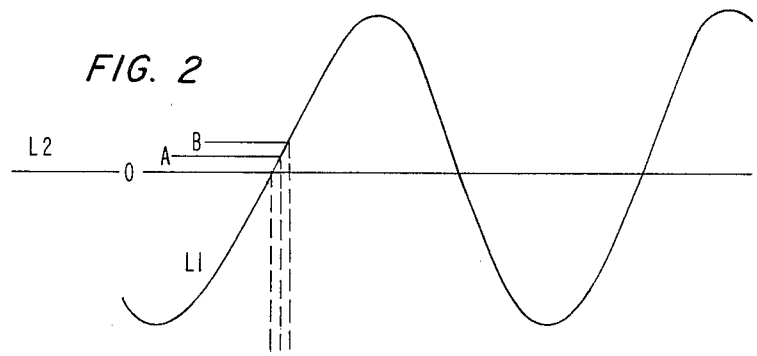
FIGS. 2 and 3 are waveform diagrams explanatory of the operation of the present invention.
Figure 3:
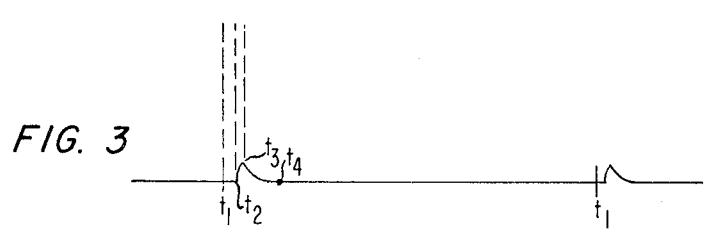

FIGS. 2 and 3 are waveform diagrams explanatory of the operation of trigger circuit 10 of FIG. 1. In FIG. 2, the AC voltage on input terminal L1 is represented by a sinusoidal wave pattern labelled L1 while the voltage on input terminal L2 is represented by the horizontal wave pattern labelled L2. Further, the Zener voltage of diode ZD1 is represented by vertical line OA while the zener voltage of diode ZD2 is represented by vertical line AB. The ordinate of FIG. 3 is the output voltage of capacitor C2 applied to the base of transistor Q1. Time t1 designates the time of zero-crossing of waveform L1 over L2. In FIG. 3, at time t1 of the positive half-cycle, the input voltage at terminal L1 becomes more positive than the input voltage at terminal L2; during time interval t1 to t2 the voltage at input terminal L1 is more positive than the voltage at input terminal L2 by less than the Zener voltage of diode ZD1; during time interval t2 to t3 the voltage at input terminal L1 is more positive than the voltage at input terminal L2 by less than the sum of the Zener voltages of diodes ZD1 and ZD2 but greater than the Zener voltage of diode ZD1; at time t3 the voltage applied by capacitor C2 to the base of transistor Q1 is maximum. During the time interval t1 to t2, the voltage applied by capacitor C2 to the base of transistor Q1 is zero; during the time interval t2 to t3, the applied voltage gradually rises; at time t3 the applied voltage is a maximum; and during the time interval t3 to t4, the applied voltage gradually diminishes back to zero.

By suitably selecting the Zener voltages of diodes ZD1 and ZD2, it is thus possible to start the base drive to transistor Q1 only after the voltage at input terminal L1 is more positive than that at input terminal L2 by a sufficient margin to permit silicon controlled rectifier SCR1 to trigger and latch itself in reliably.

The action of Zener diode ZD2 limits the time during which the base of transistor Q1 is driven to near the zero-crossing point of the input voltage wave pattern so that approximately half-cycle of power is delivered to output load terminals L3 and L4.

Regardless of the time during full-cycle that switch S1 is activated from position 1 to position 2, capacitor C1 can only discharge through diac DI1 and through transistor Q1 into the input gate terminal of three terminal switching device or silicon controlled rectifier SCR1 during the time interval that the base of transistor Q1 is driven as described above.

During successive half-cycles of the input AC voltage, the depleted charge on capacitor C1 is built up through resistor R3 if switch S1 is held activated in position 2. When the breakover voltage of diac DI1 is reached after a number of cycles of the input AC voltage, then silicon controlled rectifier SCR1 is again triggered for only a half-cycle of the input AC voltage. By suitable selection of the values or parameters of resistors R1, R2, R3 and capacitor C1, silicon controlled rectifier SCR1 can be caused to deliver a timed train of drive pulses to output load terminals L3 and L4, each drive pulse being approximately one-half cycle long and at intervals of less than a second to many seconds. Resistor R5 permits bypassing of transistor Q1 base leakage current while resistor R6 permits bypassing of silicon controlled rectifier SCR1 leakage current.

Figure 4:
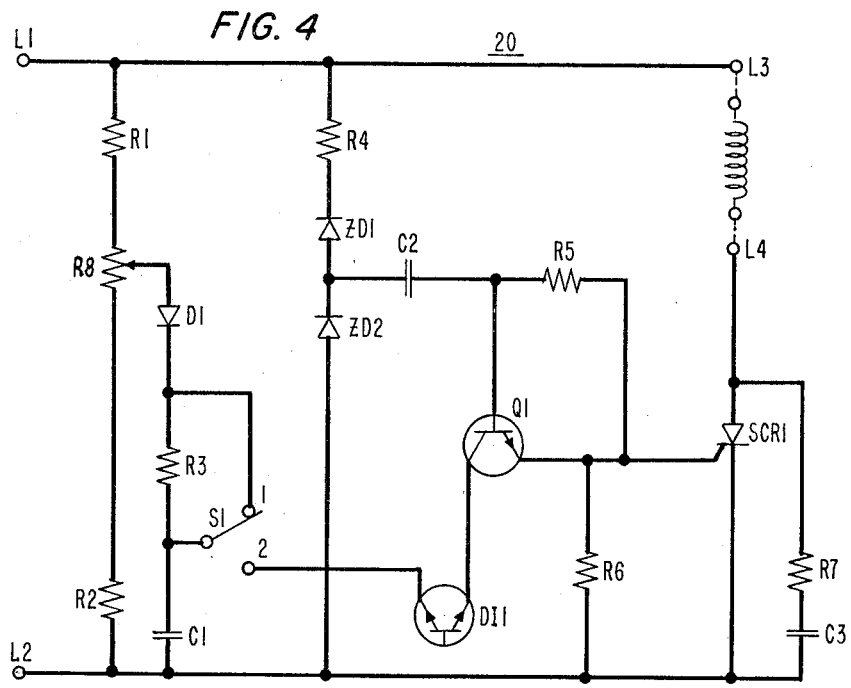
FIGS. 4, 5, and 6 are circuit diagrams of second, third, and fourth illustrative embodiments of silicon controlled rectifier trigger circuits according to the present invention.

FIG. 4 is a circuit diagram of silicon controlled rectifier trigger circuit 20 according to the present invention. Trigger circuit 20 is similar to trigger current 10 except that it further comprises adjustable potentiometer R8. In this case, the output load activation period can be selectively adjusted by varying the wiper arm position of potentiometer R8.

Figure 5:
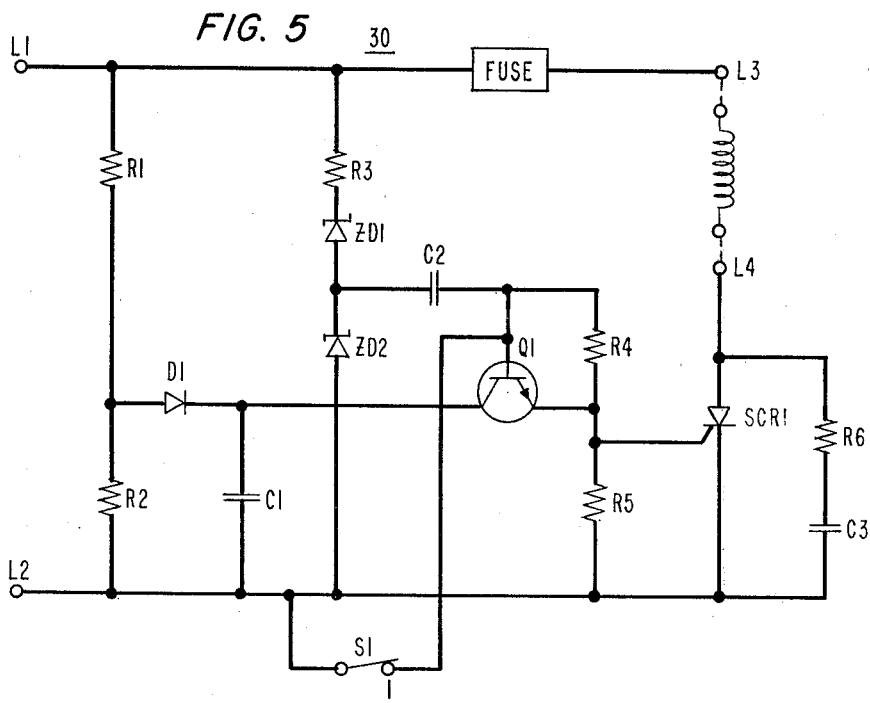

FIG. 5 is a circuit diagram of silicon controlled rectifier trigger circuit 30 according to the present invention. Trigger circuit 30 is similiar to trigger circuits 10 and 20 except that it does not include a diac nor an adjustable potentiometer. The elements of trigger circuit 30 and their recommended parameters or values are as follows:

| Element | Parameter or Value |
| --- | --- |
| Resistor R1 | 3 M ohms |
| Resistor R2 | 1 M ohms |
| Resistor R3 | 27 K ohms |
| Resistor R4 | 27 K ohms |
| Resistor R5 | 100 ohms |
| Resistor R6 | 22 ohms |
| Capacitor C1 | 0.1 microfarads |
| Capacitor C2 | 0.1 microfarads |
| Capacitor C3 | 0.1 microfarads |
| Transistor Q1 | 2N4410 |
| Silicon Controlled Rectifier SCR1 | Teccor or RCA |
| Fuse | as desired |
| Switch S1 | On-Off Switch, normally closed |
| Diode D1 | IN4003 |
| Zener diode ZD1 | IN967 |
| Zener diode ZD2 | IN967 |

Trigger Circuit 30 is advantageously utilized to provide one and only one pulse per switch S1 activation, i.e. no repeat function. In other words, trigger circuit 30 provides a single drive pulse on a non-repeating basis to output load terminals L3 and L4 whenever switch S1 is activated from the closed state, position 1, to the open state. While switch S1 is in the closed state, the base of transistor Q1 is held at zero volts relative to the emmitter and therefore transistor Q1 does not conduct. The charge on capacitor C1 builds up gradually over several cycles of the input AC voltage. Such buildup time is determined by the values of resistors R1 and R2, while the final voltage to which capacitor C1 is charged is specifically determined by the ratio of resistors R1 and R2. Once switch S1, which is normally closed, is opened then the base of transistor Q1 is driven by a pulse derived in the manner heretofore described in detail. When transistor Q1 conducts, the charge on capacitor C1 is passed to the input gate of silicon controlled rectifier SCR1 whereupon SCR1 fires for one-half cycle of the input AC voltage. The values of resistors R1 and R2 are chosen such that while switch S1 is held open, insufficient charge passes to capacitor C1 to re-trigger SCR1. However, the charge passed to capacitor C1 is exhausted everytime the base of transistor Q1 is pulsed. This silicon controlled rectifier SCR1 fires once and only once every time switch S1 is activated or opened.

Figures 6, 7:
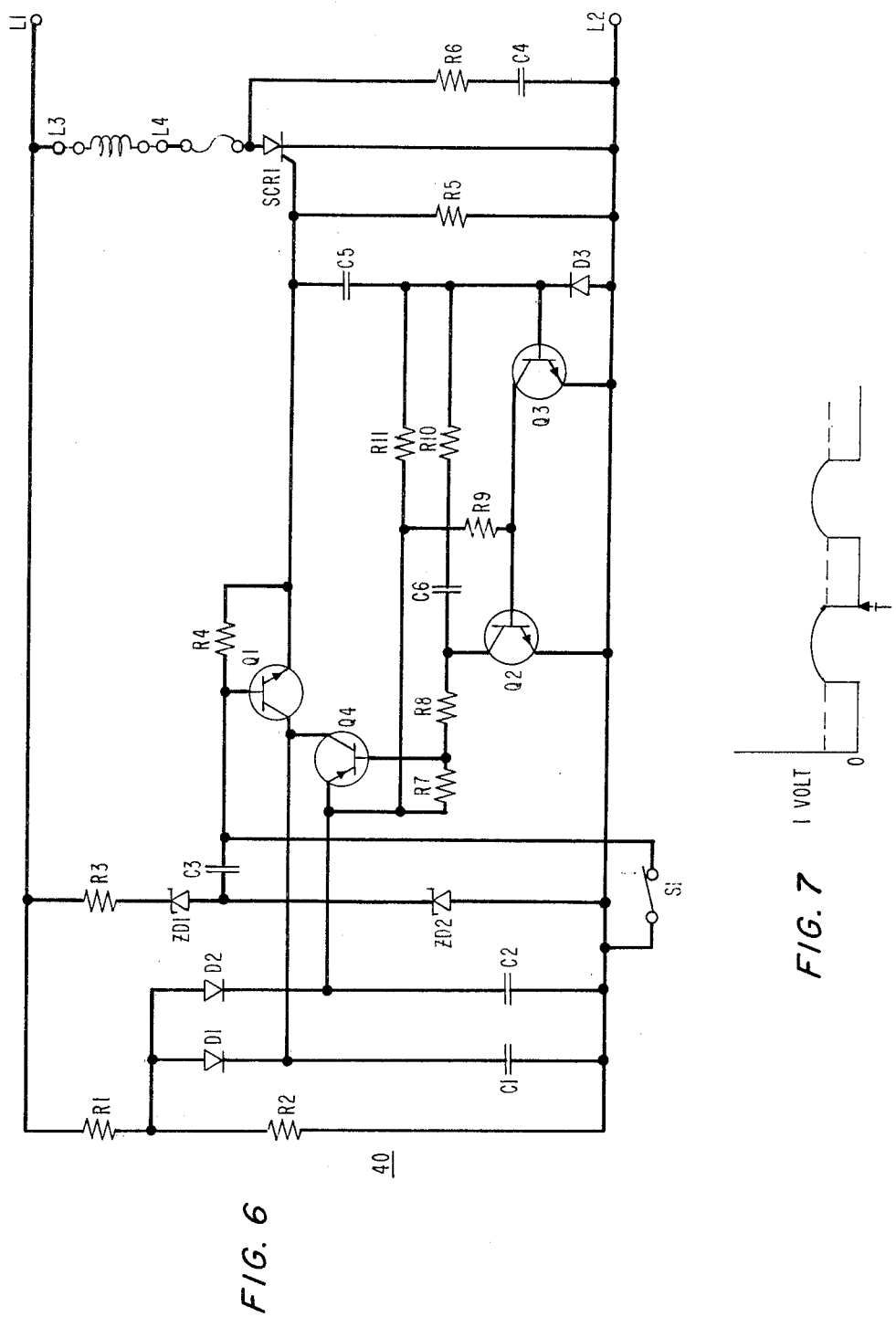
FIG. 7 is another waveform diagram explanatory of the operation of the present invention.

FIG. 6 is a circuit diagram of silicon controlled rectifier trigger circuit 40 according to the present invention. Trigger circuit 40 is similiar to trigger circuit 30 except that it has extra elements as reflected by the following:

| Element | Parameter or Value |
| --- | --- |
| Resistor R1 | 1 M ohms |
| Resistor R2 | 330 K ohms |
| Resistor R3 | 27 K ohms |
| Resistor R4 | 27 K ohms |
| Resistor R5 | 100 ohms |
| Resistor R6 | 22 ohms |
| Resistor R7 | 1 M ohms |
| Resistor R8 | 220 K ohms |
| Resistor R9 | 1 M ohms |
| Resistor R10 | 330 K ohms |
| Resistor R11 | 3 M ohms |
| Capacitor C1 | 0.1 microfarads |
| Capacitor C2 | 0.22 microfarads |
| Capacitor C3 | 0.1 microfarads |
| Capacitor C4 | 0.1 microfarads |
| Capacitor C5 | 0.001 microfarads |
| Capacitor C6 | as desired |
| Diode D1 | IN4003 |
| Diode D2 | IN4003 |
| Diode D3 | IN4154 |
| Zener Diode ZD1 | IN967 |
| Zener Diode ZD2 | IN967 |
| Silicon Controlled Rectifier SCR1 | Teccor or RCA |
| Transistor Q1 | 2N4410 |
| Transistor Q2 | 2N4410 |
| Transistor Q3 | 2N4410 |
| Transistor Q4 | 2N4248 |
| Switch S1 | ON-OFF Switch |

Trigger circuit 40 is advantageously utilized to provide two drive pulses to output load terminals L3 and L4 per activation of switch S1. The first drive or input gate pulse to silicon controlled rectifier SCR1 is derived from capacitor C1 which, in conjunction with the triggering circuitry comprising resistor R3, capacitor C3, and zener diodes ZD1 and ZD2, provides a first actuation of the load connected between terminals L3 and L4 in the manner previously described in connection with the earlier embodiments. In this circuit 40, diode D2 and capacitor C2 effect accumulation of charge on capacitor C2 and transistor Q4 thereby permitting the charge on capacitor C2 to be passed to silicon controlled rectifier SCR1 and a one-shot multivibrator formed by transistors Q2 and Q3, to perform a second actuation of rectifier SCR1. At the trailing edge of the first gate pulse appearing at the gate of silicon controlled rectifier SCR1, capacitor C5 triggers the one-shot multivibrator circuit. See FIG. 7, which is a waveform diagram explanatory of the operation of trigger circuit 40 and wherein point T illustrates the first input gate pulse trailing edge. The combination of capacitor C6 and resistor R10 determines the pulse output duration of one-shot multivibrator Q2, Q3 and their component values are so selected that the length of such output pulse is sufficient for formation of the second trigger pulse applied to silicon controlled rectifier SCR1. With the suggested component values recited above, and a line frequency of 60 Hz., the multivibrator output pulse duration exceeds 9 milliseconds.

While the one-shot multivibrator is active—i.e. after it has been triggered by discharge of capacitor C5—the base of transistor Q4 is connected to relative ground (terminal L2) through transistor Q2, and transistor Q4 becomes conductive. The charge stored in capacitor C2 is accordingly available at the collector of transistor Q1 so that when Q1 is activated, a trigger pulse of the charge stored in capacitor C2 is applied to the gate of silicon controlled rectifier SCR1 to fire it a second time. Transistor Q1 is activated in the same manner as previously described—in conjunction with resistor R3, capacitor C3, and zener diodes ZD1 and ZD2—at a given time following the zero crossing of A.C. voltage source lead L1 into the positive zone. Resistors R1 and R2 are so selected to ensure that capacitors C1 and C2 do not accumulate sufficient charge during any single cycle of the A.C. supply to permit triggering of silicon controlled rectifier SCR1. By suitable selection of the values of resistors R1 and R2, the precise time required to charge capacitors C1 and C2 to a sufficient level for triggering of rectifier SCR1 can be predetermined. At the same time, each triggering of SCR1 should dissipate substantially all of the charge stored in the respective capacitor C1 or C2. Thus, silicon controlled rectifier SCR1 cannot again be triggered until switch S1 is released (or returned to its first position), thereby effectively grounding the base of transistor Q1 and permitting the charge to build up on capacitors C1 and C2.

As in the earlier-described embodiments, capacitor C3 is utilized in conjunction with resistor R3 and zener diodes ZD1 and ZD2 to apply a shaped voltage pulse to the base of transistor Q1 as illustrated in FIGS. 2 and 3. Resistor R6 and capacitor C4 provide transient protection to silicon controlled rectifier SCR1, the main function of this series combination being to prevent false triggering of rectifier SCR1 by the high rate of voltage change applied to its anode when the circuit 40 happens to be turned on at the positive peak voltage of the A.C. supply. During operation of the unit 40, the capacitor C4 and resistor R6 combination further compensates for the highly inductive nature of the load by ensuring that silicon controlled rectifier SCR1 turns off cleanly.

While the arrangement according to the present invention has been described in terms of specific illustrative embodiments, it will be apparent to those skilled in the art that many modifications are possible within the spirit and scope of the disclosed principle.

What is claimed is:

1. A trigger circuit which is responsive to an input AC voltage for providing at least one drive pulse to a load circuit, said trigger circuit comprising:
   switch means having first and second positions, said drive pulse being provided to said load circuit when said switch means is in said second position;
   first charge storage means responsive to said input AC voltage when said switch means is in said first position;
   first two-terminal switching means conductive when said input AC voltage is greater than a first predetermined value;
   second charge storage means responsive to said input AC voltage when said first two-terminal switching means is conductive;
   first three-terminal switching means for conduction in response to discharge of said second charge storage means; and
   second three-terminal switching means conductive when said first three-terminal switching means is conductive and when said switch means is in said second position, wherein conduction of said second three-terminal switching means passes said pulse to said load circuit.

2. The trigger circuit of claim 1 wherein said first charge storage means is a first capacitor.

3. The trigger circuit of claim 1 wherein said first two-terminal switching means is a first Zener diode whose breakdown voltage is reached when said input AC voltage reaches said first predetermined value.

4. The trigger circuit of claim 1 wherein said second charge storage means is a second capacitor which connects said first two-terminal switching means and said first three-terminal switching means.

5. The trigger circuit of claim 1 wherein said first three-terminal switching means is a transistor whose base is connected to said second charge storage means.

6. The trigger circuit of claim 1 wherein said second three-terminal switching means is a silicon controlled rectifier whose input gate terminal is connected to said first three-terminal switching means.

7. The trigger circuit of claim 1 further comprising second two-terminal switching means being conductive when said input AC voltage is greater than a second predetermined value, said first and second two-terminal switching means being connected in series, said second charge storage means connecting the common terminal of said first and second two-terminal switching means and said first three-terminal switching means, and said first three-terminal switching means being non-conductive when said input AC voltage is greater than said second predetermined value.

8. The trigger circuit of claim 7 wherein said second two-terminal switching means is a second Zener diode whose breakdown voltage is reached when said input AC voltage reaches said second predetermined value.

9. The trigger circuit of claim 7 wherein said first three-terminal switching means becomes conductive near the zero crossover point of said input AC voltage in the conductive state of said first two-terminal switching means.

10. The trigger circuit of claim 7 wherein said second three-terminal switching means becomes conductive near the zero cross-over point of said input AC voltage in response to the conductive states of said first and second two-terminal switching means, whereby the conduction of said second three-terminal switching means passes said drive pulse to said load circuit throughout a substantial portion of a half-cycle of said input AC voltage.

11. The trigger circuit of claim 7 wherein said first three-terminal switching means becomes non-conductive near the zero cross-over point of said input AC voltage in the conductive states of said first and second two-terminal switching means.

12. The trigger circuit of claim 1 further comprising a four-layer diode which is serially interposed between the second position of said switch means and said first three-terminal switching means, said second three-terminal switching means being conductive for the substantial portion of one half-cycle of said input AC voltage when the breakdown voltage of said four-layer diode is reached.

13. The trigger circuit of claim 1 further comprising first and second resistive means which are serially interposed between the terminals of said input AC voltage, said first charge storage means developing a voltage which is determined by the ratio of said first and second resistive means.

14. The trigger circuit of claim 7 further comprising first and second resistive means which are serially interposed between the terminals of said input AC voltage, said second three-terminal switching means being actuatable to pass a train of drive pulses to said load circuit when said switch means is maintained in said second position, the time interval between each such pulse being determined by said first and second resistive means.

15. The trigger circuit of claim 14 further comprising potentiometer means connecting the common terminal of said first and second resistive means and said first charge storage means for enabling variation of the time interval between each such drive pulse.

16. The trigger circuit of claim 7 further comprising first and second resistive means which are serially interposed between the terminals of said input AC voltage, the values of said first and second resistive means being such that substantially no charge is accumulated by said first charge storage means when said switch means is in said second position, whereby said second three-terminal switching means is actuated to pass only one drive pulse to said load circuit upon activation of said switch means from said first position to said second position.

17. The trigger circuit of claim 7 further comprising:
   third charge storage means responsive to said AC input voltage when said switch means is in said first position; and
   third three-terminal switching means for conduction immediately following conduction of said second three-terminal switching means,
   said second three-terminal switching means being rendered conductive again by said third charge storage means during conduction of said third three-terminal switching means to pass a second drive pulse to said load circuit.

* * * * *